(12) United States Patent
Birk

(10) Patent No.: US 10,089,905 B2
(45) Date of Patent: Oct. 2, 2018

(54) LABEL FOR COVERING AN OPENING LOCATED IN A WALL

(71) Applicant: Schreiner Group GmbH & Co. KG, Oberschleissheim (DE)

(72) Inventor: Uwe Birk, Munich (DE)

(73) Assignee: Schreiner Group GmbH & Co. KG, Oberschleissheim (DE)

( * ) Notice: Subject to any disclaimer, the term of this patent is extended or adjusted under 35 U.S.C. 154(b) by 0 days.

(21) Appl. No.: 15/027,524

(22) PCT Filed: Oct. 28, 2014

(86) PCT No.: PCT/EP2014/073134
§ 371 (c)(1),
(2) Date: Apr. 6, 2016

(87) PCT Pub. No.: WO2015/063095
PCT Pub. Date: May 7, 2015

(65) Prior Publication Data
US 2016/0253928 A1 Sep. 1, 2016

(30) Foreign Application Priority Data

Oct. 29, 2013 (DE) ........................ 10 2013 111 917

(51) Int. Cl.
*B32B 3/10* (2006.01)
*B32B 3/24* (2006.01)
(Continued)

(52) U.S. Cl.
CPC .................. *G09F 3/02* (2013.01); *G09F 3/10* (2013.01); *H05K 5/0213* (2013.01); *G09F 2003/0261* (2013.01)

(58) Field of Classification Search
CPC . Y10T 428/14; Y10T 428/24331; B32B 3/20; B32B 3/266; B32B 7/12;
(Continued)

(56) References Cited

U.S. PATENT DOCUMENTS 6,095,568 A 8/2000 Fendt et al.
6,506,110 B1 1/2003 Borisch
(Continued)

FOREIGN PATENT DOCUMENTS

DE 196 53 890 A1 6/1998
DE 197 08 116 C2 2/1999
(Continued)

OTHER PUBLICATIONS

International Search Report of PCT/EP2014/073134, dated Jan. 26, 2015.

*Primary Examiner* — Joanna Pleszczynska
(74) *Attorney, Agent, or Firm* — Collard & Roe, P.C.

(57) ABSTRACT

A label with which an opening situated in a wall can be covered comprises a gas-permeable element (30) that is embedded between a base layer (10) and a top layer (20). Base layer and top layer have openings (11, 21) that overlap one another. The gas-permeable element is disposed between an adhesive layer (102) of the base layer and the top layer (20). According to embodiments, the opening of the top layer can project (A) beyond the edge of the opening of the lower layer and/or the top layer can project (B) beyond the outer edge of the lower layer. The label demonstrates sufficient mechanical stability and prevents the escape of adhesive.

18 Claims, 2 Drawing Sheets

Figure 1:
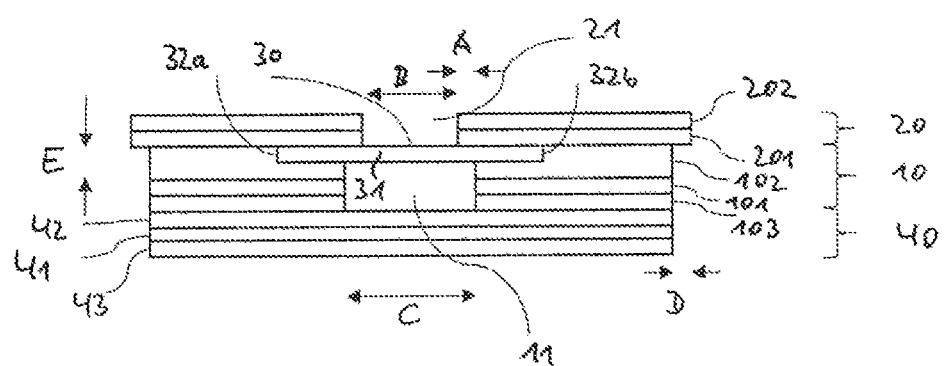

(51) Int. Cl.
*B32B 7/12* (2006.01)
*G09F 3/02* (2006.01)
*G09F 3/10* (2006.01)
*H05K 5/02* (2006.01)

(58) Field of Classification Search
CPC ...... B32B 2307/724; B32B 2307/7265; B32B 2519/00; B32B 2581/00; G09F 3/02; G09F 3/10; H05K 5/0213; H05K 5/02
USPC ........................................ 428/137, 343, 188
See application file for complete search history.

(56) References Cited

U.S. PATENT DOCUMENTS

| | | |
|---|---|---|
| 7,687,135 B2 | 3/2010 | Birk |
| 2006/0040092 A1 | 2/2006 | Birk |
| 2006/0165935 A1* | 7/2006 | Studer ................. B01D 53/228 428/40.1 |
| 2009/0047896 A1 | 2/2009 | Wolff |
| 2013/0025457 A1* | 1/2013 | Furuuchi ............... F21S 48/335 96/4 |

FOREIGN PATENT DOCUMENTS

| | | |
|---|---|---|
| DE | 196 53 890 B4 | 10/2005 |
| DE | 10 2004 046 164 A1 | 4/2006 |
| DE | 10 2005 021 301 B4 | 1/2010 |
| EP | 1 034 692 B1 | 9/2000 |
| EP | 1 593 478 B1 | 9/2006 |
| EP | 1 858 309 A1 | 11/2007 |
| EP | 1 630 769 B1 | 10/2008 |
| EP | 1 806 039 B1 | 5/2010 |
| WO | 2006/032570 A2 | 3/2006 |

\* cited by examiner

LABEL FOR COVERING AN OPENING LOCATED IN A WALL

CROSS REFERENCE TO RELATED APPLICATIONS

This application is the National Stage of PCT/EP2014/073134 filed on Oct. 28, 2014, which claims priority under 35 U.S.C. § 119 of German Application No. 10 2013 111 917.4 filed on Oct. 29, 2013, the disclosure of which is incorporated by reference. The international application under PCT article 21(2) was not published in English.

The invention relates to a label for covering an opening situated in a wall, which label has a base layer, a top layer, and a gas-permeable element disposed between them.

Labels that contain a gas-permeable element are used to cover openings in walls or containers, so that gaseous substances can be exchanged between the interior enclosed by the wall and the outer surroundings. The gas-permeable element of the label retains contaminants and is extensively or completely non-permeable for liquids. Such labels serve as pressure equalization elements, for example in housings for electronic modules, which elements offer protection against the entry of dust, contaminants or wetness, or in microphones, for example, as moisture protection and dust protection for the electronic modules.

On the one hand, sufficient mechanical stability of the label is important, so that automated production and further processing of the label, using roll processing machines, is possible. For this purpose, in particular, the membrane is supposed to be well connected with the layer structure of the label. Because the layers are connected with one another by way of pressure-sensitive adhesives, escape of adhesive is supposed to be prevented to the greatest possible extent, because such escape can impair or interrupt the production process. Finally, it should be possible to produce the label as cost-advantageously as possible, in order to allow mass use.

There is therefore a need for indicating a label for covering an opening situated in a wall, which label is mechanically stable and prevents escape of adhesive to the greatest possible extent, in order to prevent contamination of the label or of the surroundings with adhesive.

According to the present invention, this task is accomplished by means of a label according to the characteristics of claim 1.

According to embodiments, a label for covering an opening situated in a wall comprises: a base layer having an opening, wherein the base layer comprises adhesive; a top layer having an opening, wherein the base layer and the top layer are disposed one on top of the other, and the opening of the base layer and the opening of the top layer overlap; a gas-permeable element, which is disposed between the tap layer and the base layer that comprises the adhesive, wherein the gas-permeable element comprises a section that lies in the region of the overlapping openings of the base layer and of the top layer, and a further section that lies between overlapping regions of the base layer and of the top layer.

The gas-permeable element is disposed between the base layer and the top layer in mechanically stable manner. Because of the fact that the gas-permeable element lies between the base layer that comprises an adhesive and the top layer, no adhesive that could escape is situated between the gas-permeable element and the top layer. Contamination of the label in the region of the gas-permeable element, at the top of the label, by means of escaping adhesive, is therefore prevented.

According to embodiments, the top side of the gas-permeable element directly contacts the top layer, while fixation of the gas-permeable element within the label composite is provided by means of the adhesive of the base layer, which adhesive contacts the gas-permeable, element from the bottom, i.e. on the side facing the base layer. For this purpose, the side of the base layer that faces the top layer or the gas-permeable element is coated with adhesive.

According to an embodiment, the base layer itself can be formed from or consist of only a layer of adhesive, for example what is called a transfer adhesive. The transfer adhesive fixes the gas-permeable element in place, on the one hand, and on the other hand serves to glue the label onto the wall having the opening to be covered. A label of this embodiment is particularly flexible, and is suited for being glued onto a curved wall.

According to a further embodiment, the top layer can be structured to be larger than the base layer, so that the outer edge of the top layer projects beyond the edge of the base layer by a certain dimension. The base layer is therefore covered by the top layer from above, i.e. seen from the top layer, because the edge of the base layer is recessed relative to the edge of the top layer. If adhesive were nevertheless to escape from the base layer in this case, this escaping adhesive is covered by the projecting part of the top layer, so that it does not contaminate the surroundings of the label. This is important if a great number of labels is coiled up onto a roll and processed in an automated roll processing process, at high speed. Any kind of contamination could disrupt or interrupt the automated high-speed processing process, and this should be avoided, if at all possible.

Furthermore, the opening in the top layer, underneath which the gas-permeable element is situated, can be configured to be smaller than the related opening in the base layer. This means that the edge of the opening in the top layer projects beyond the edge of the opening in the base layer, and therefore the edge of the opening in the top layer, seen in projection, projects into the opening in the base layer. This ensures good mechanical stability, on the one hand, and, on the other hand, ensures that any adhesive possibly escaping from the base layer into the opening is covered by the projecting part of the top layer, which projects into the opening of the base layer, and does not possibly escape upward or outward through the gas-permeable element.

Technical empirical values are available for this projecting part of the top layer beyond the edge of the base layer or beyond the edge of the opening in the base layer. For example, the edge of the opening of the top layer can project beyond the edge of the opening of the base layer by a dimension of between 0.3 mm (millimeter) to 0.7 mm, so that the opening of the top layer is correspondingly smaller than the opening of the base layer. If the production process is organized well, this dimension can amount to between 0.4 mm up to 0.6 mm. In a practical embodiment, the dimension can amount to around 0.5 mm or to 0.5 mm.

For the projecting part of the top layer beyond the outer edge of the base layer at the outer ends of the label, it is advantageous that the overhang amounts to approximately 8 times to 12 times the thickness of the adhesive layer that lies underneath it, or a dimension of 0.4 mm to 1.2 mm. In a special embodiment, the overhang can amount to 10 times the thickness of the adhesive situated underneath it. If the adhesive layer has a thickness of 0.05 mm to 0.1 mm, a dimension of 0.5 mm to 1 mm is recommended for the overhang of the top layer beyond the outer edge of the base layer.

In a further embodiment, a plurality of smaller openings can be present in the region of the gas-permeable element in the top layer, instead of a single, large opening. The smaller openings can have a diameter of about 0.8 mm. In this way, sufficient gas exchange between the interior of the wall and the outer surroundings is possible, on the one hand, while on the other hand, the surface is mechanically stable and protected against penetration of thin objects, if this is required for the use of the label.

In a further embodiment, the top of the label can be coated with a printing ink, over its full area or in partial areas, on the one hand, so that contrasting imprinting with letters, symbols, barcodes or 2D codes is possible. On the other hand, the top layer can be structured in such a manner that laser inscribing is possible. Laser inscribing has the advantage that it can be applied individually at a very late point in time of use of the label, for example immediately before or even after dispensing onto a container. A layer structure that can advantageously be used for laser inscribing comprises an aluminum vapor coating instead of the printing ink on the top layer. Alternatively and preferably, a laser-active layer can be present below the top layer, i.e. facing the membrane and facing the base layer, and, in turn, underneath that, a reference layer can be present, which makes a contrast color available. The laser-active layer can contain metal particles, for example aluminum particles, which change to the laser effect and ensure that the originally opaque layer becomes transparent after the laser effect, at the location impacted by the laser beam. Then the contrast color, for example a dark or black layer, is visible instead of the white or silvery laser-active layer, and forms a contrast to the latter.

According to embodiments, the gas-permeable element can be a membrane that is permeable for gaseous substances but blocks liquid. In this way, gas exchange between an inner volume and the outer surroundings is possible, wherein the inner volume is protected against the entry of wetness. The gas-permeable element can also be structured as a woven fabric, which possesses a membrane having a greater mesh width as compared with the tight mesh pattern, so that the woven fabric is more permeable for acoustic energy in comparison with a membrane. Such a woven fabric is nevertheless impermeable for liquid in the form of droplets. The use of a woven fabric as an embodiment for the gas-permeable element is recommended, for example, in the case of acoustic uses, for example in the case of microphones.

In the production of the label, the base layer according to the above embodiments can be structured as an adhesive tape coated with adhesive on both sides, wherein the center layer is formed from polymer film, for example polyester film. A circular opening is punched into the double-sided adhesive tape as an opening for the membrane. The gas-permeable element, for example a membrane or a woven fabric, has a larger diameter than the aforementioned opening, and can be structured to be circular, rectangular or square, possibly with rounded corners, and is positioned above the opening in the base layer. The top layer comprises a polymer film, for example a polyester film, into which the circular opening for the membrane is punched, wherein its diameter is smaller than the opening punched into the base layer. The elements are made available as material webs and joined together in a roll processing process, by machine, for production of the label. The region in which top layer and bottom layer adhere to one another is significantly larger and, seen in cross-section, has a significantly longer expanse than the gas-permeable element or the region in which the gas-permeable element is glued in between top layer and base layer.

Figure 2:
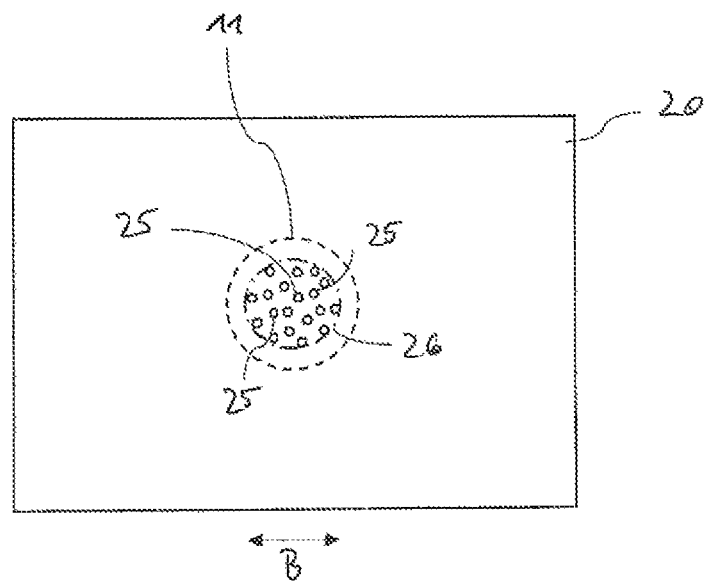
Figure 3:
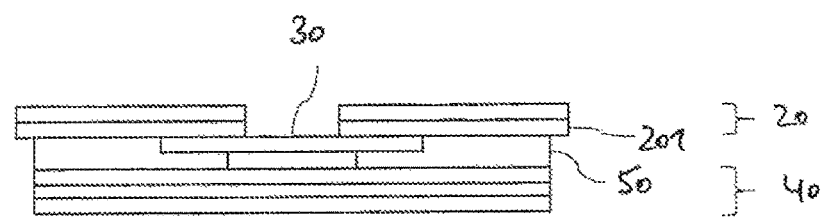
Figure 4:
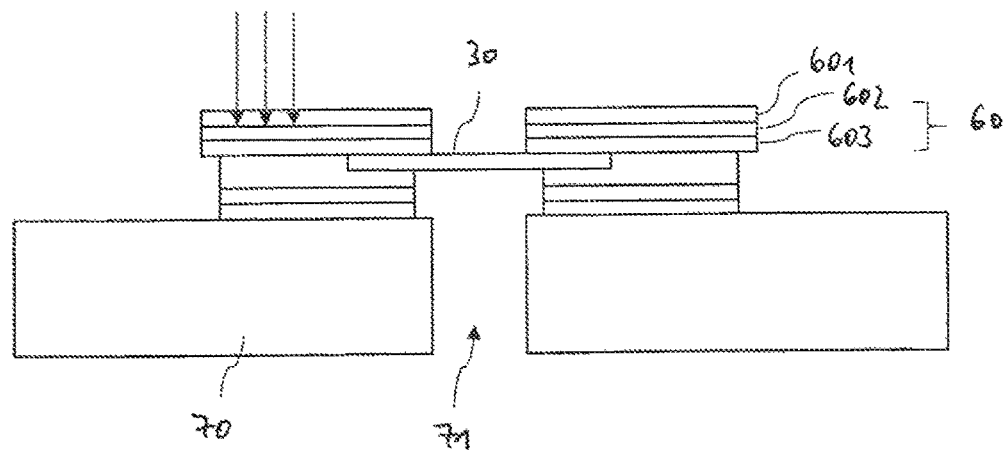

In the following, the invention will be explained in greater detail using the exemplary embodiments shown in the drawing. The figures show:

FIG. 1 a cross-section through a label having a gas-permeable element;

FIG. 2 a top view of a label according to an embodiment in which a plurality of smaller openings is provided in the top layer, in the region of the gas-permeable element;

FIG. 3 a cross-section through an embodiment in which the bottom layer merely comprises a transfer adhesive; and FIG. 4 a label having a top layer that, can be laser-inscribed, which label is glued onto a wall having an opening.

In the figures of the drawing, the size relationships are not shown to scale. Instead, in the drawing the fundamental layer structure or a top view of it, and the relative position of the layers relative to one another are shown in principle, wherein relative and absolute size relationships are not reproduced to scale. For example, in practice, the label extends clearly longer between membrane and outer edge than shown in the drawing, for reasons of clarity.

In FIG. 1, a cross-section through a label for covering an opening situated in a wall is shown according to an exemplary embodiment. The label comprises a top layer 20 as well as a base layer 10. An underside of the top layer 20 is connected with the base layer. The top layer 20, in detail, comprises a polymer film 201 as well as a printing ink 202 optionally applied to the latter. An opening 21 is introduced into the top layer 20, which opening is circular with diameter B in the example of the embodiment shown. The base layer 10 comprises a polymer layer 101, on the top of which an adhesive layer 102 is applied, and on the underside of which a further adhesive layer 103 is applied. In the exemplary embodiment, this is a section of a double-sided adhesive tape. The films 201, 101 preferably consist of the same material. A polyester film can be used as the polymer film 101, 102, in each instance, which film demonstrates sufficient strength for the intended cases of use. If the label is supposed to be glued over a curved body and to be correspondingly flexible, the use of a film composed of polyethylene (PE) or polyvinyl chloride (PVC) is also possible.

The underside of the top layer 20 is connected with the top adhesive layer 102 of the base layer 10. In the base layer 10, there is an opening 11, which is circular with diameter C in the example of the embodiment shown. The openings 21, 11 of top layer and base layer, respectively, overlap one another. Because the diameter B is smaller than the diameter C, the openings 21, 11 overlap completely, i.e. in a projection of the opening 21 into the plane of the opening 11, the projected openings lies completely within the opening 11.

A gas-permeable element 30 is disposed between the top layer 20 and the base layer 10. The gas-permeable element comprises a center section 31, which lies in the region of the overlapping openings 21, 11. Furthermore, the gas-permeable element 30 comprises sections 32a and 32b, which lie between the overlapping sections of top layer 20 and base layer 10. In this connection, a top of the gas-permeable element 30, which faces top layer 20, contacts the underside of the polymer film 201. An underside of the gas-permeable element 30, which faces the base layer 10, contacts the adhesive layer 102 of the base layer 10. The gas-permeable element 30 is disposed between polymer film 201 and adhesive 102, and thereby fixed in place.

In particular, the underside of the polymer layer 201 of the top layer 20 is not equipped with an adhesive layer, but rather contacts the gas-permeable element 30 in the region around the opening 21, and is firmly connected with the adhesive layer 102 of the base layer 10 in the region outside of the gas-permeable element. As a result, the gas-permeable element 30 is firmly integrated into the layer composite, on the one hand. The strength of the adhesive connection provided by the adhesive layer 102 can be adjusted by means of a suitable selection of the adhesive strength of the adhesive 102, so that even in the case of rotational processing of the label by machine, the membrane is securely held in the layer composite. On the other hand, there is no adhesive situated between the gas-permeable element 30 and the polymer film 201 of the top layer 20, so that no adhesive that might possibly escape is present at the top of the gas-permeable element. Instead, the adhesive is situated on the underside, i.e. the side of the gas-permeable element 30 that faces the base layer 10. Even if adhesive were to escape here, the blocking effect of the gas-permeable element 30 prevents the adhesive from getting to the outside of the gas-permeable element 30. In addition, the opening 21 in the top layer 20 has a smaller diameter B than the opening 11 in the base layer 10, with the diameter C, so that the edge of the opening in the top layer 20 projects beyond the edge of the opening 11 in the base layer 10 by the distance A. Adhesive that possibly escapes from the adhesive layer 102 is covered by the edge of the top opening 21 that projects by the distance A, even if it were to possibly pass through the gas-permeable element 30 after an extended period of time. Therefore possible escape of adhesive is reliably covered in the region of the gas-permeable element, so that the adhesive remains within the layer and does not possibly escape to the outside and contaminate the label or processing machines.

At the outer edge of the label, as shown in the drawing on the right and left, the adhesive layer 102 of the base layer 10 is directly in contact with the polymer layer 201 of the top layer 20. In disadvantageous handling cases, adhesive 102 can escape beyond the edge of the base layer 10. In this regard, it is provided that the top layer 20, particularly the polymer layer 201, projects beyond the outer edge of the base layer 10 with a distance D. Even if adhesive 102 escapes from the base layer 10, it is covered by the top layer 20, so that it is not given off to the surroundings. Contamination of the label, of the wall on which the label is applied or of processing machines is prevented. The escape of adhesive from the layer composite, which is sometimes unavoidable, is therefore made harmless to such an extent that it does not escape beyond the top edge of the label that has been glued on.

Therefore, a relatively stable label arrangement is created by the label shown in FIG. 1, on the one hand, so that the gas-permeable element 30 is embedded in the layer composite of the label in stable manner. On the other hand, escape of adhesive or bleeding of adhesive beyond the label is effectively prevented.

Finally, in FIG. 1 a further adhesive layer 103 is provided in the base layer 10, which layer is applied on the underside of the polymer layer 101 of the base layer 10, i.e. on the side of the base layer 10 that faces away from the top layer 20. The label is glued onto a wall of a housing or of a container, in which an opening that has been introduced is supposed to be covered, with the adhesive layer 103. The overhang D of the top layer 20 also serves to prevent possible bleeding of the adhesive out of the adhesive layer 103, as described above in connection with the adhesive layer 102. Before use of the label, the adhesive layer 103 is usually covered by a cover layer 40, as is usual in the case of self-adhesive labels. For example, the cover layer 40 comprises a polymer film 41, for example composed of PET, which is provided, on the top that faces the adhesive, with a silicone layer 42, in order to reduce the adhesion of the adhesive layer 103 to the cover layer 40. The cover layer 40 can therefore easily be pulled off the adhesive layer 103. Optionally, an adhesive-repelling back-side coating 43 can furthermore be present in the cover layer 40. The cover layer 40 can be a continuous liner onto which a plurality of labels is glued, so that this plurality of labels is rolled up for interim storage and then is available for being dispensed onto a wall or a container, by means of a roll processing machine.

The gas-permeable element 30 can be a membrane that is gas-permeable on the one hand, but on the other hand blocks the passage of any liquids or liquid components. The label can then be used as a pressure equalization element, in which the interior of a housing provided with the covered opening is present under controlled humidity conditions. Furthermore, the membrane protects against the entry of dust or entry of any solid substances or contaminants into the interior of the housing. Instead of a membrane, a woven fabric having a clearly larger mesh width can also be used, wherein the mesh width is adjusted in such a manner that dust and solid substances or contaminants are blocked, and furthermore the passage of liquid in droplet form is blocked. A larger mesh width has the advantage, as compared with a very tight-mesh membrane, that the woven fabric is acoustically more permeable than the membrane. Such a woven fabric is suitable, among other things, for covering acoustically sensitive modules, for example microphones.

In a practical embodiment, the opening within the top layer 20 is a circular opening with a diameter of 5 mm. In this exemplary embodiment, the opening 11 in the base layer 10 is a circular opening with a diameter of 6 mm. The membrane or the woven fabric disposed in between is punched in circular or rectangular manner, particularly square, wherein the corners are rounded off. The membrane has a diameter of 10 mm or has an edge length of 10 mm. The outside dimension of the label is at least 20 mm. In order to achieve good adhesion of the label on the wall, the label can be configured to be rectangular, in practice, with outside dimensions of the rectangle edges of 25 mm*50 mm.

The measures described below can be used for dimensioning of the distances A and D. For the distance A, which represents the overhang of the opening 21 in the top layer 20 over the edge of the opening 11 in the base layer 10, a range between 0.3 mm to 0.7 mm can generally be used. In the case of sufficient positional accuracy of the layer 20 relative to the layer 10 during production of the label, 0.4 mm to 0.6 mm can be achieved for the distance A. On average or in the case of sufficiently precise positioning during production, the distance A amounts to 0.5 mm. This suffices to guarantee mechanically sufficient strength for the gas-permeable element as such and for the layer composite in the region of the openings, so that the risk of rupture of the gas-permeable element or of the label is prevented. Furthermore, bleeding out of the adhesive 102 underneath the membrane layer, beyond the edge of the opening 21, is prevented by means of this overhang.

The distance D, which indicates the overhang of the top layer 20 over the outer contour or the edge of the base layer 10, is recommended to be 8 times to 12 times the thickness E of the adhesive of the layer 102. On average or in particular cases, the overhang D can amount to 10 times the thickness of the adhesive layer 102. If one takes into consideration that the adhesive layer 102 can be on the order of 0.05 mm to 0.1 mm in usual application cases, the distance D lies in the range of 0.4 mm to 1.2 mm or, in particular, between 0.5 mm to 1 mm. As a result, the escape of adhesive beyond the top label edge of the top layer 20 is reliably prevented.

In FIG. 2, a modification of the label shown in FIG. 1 is shown in the region of the opening 21, in a top view of a label. In deviation from FIG. 1, the label in FIG. 2 does not have an opening 21 punched out over a full area, but rather a plurality of relatively small holes 25 punched out of the top layer 20 is situated in the region of an enveloping line 26. The envelope end 26 is a circular line with the diameter B. The number of holes 25 within the line 26 is adjusted in such a manner that sufficient gas flow in accordance with the intended technical use is possible. On the other hand, the punch-outs 25 are provided to be sufficiently small and in a sufficient number, so that the remaining material of the top layer 20 is sufficiently stable, particularly has sufficient stability with regard to the penetration of thin or pointed objects. In an exemplary embodiment, the punch-outs 25 are circular and have a diameter of 0.8 mm. In the top view of FIG. 2, the edge of the opening 11 in the base layer 10 is supplementally shown as a broken line; this edge is actually not visible from the top. It can be seen that all the punch-outs 25 overlap with the opening 11 in the base layer, and lie within an imaginary projection within the opening 11.

In FIG. 3, a further embodiment is shown, in which the label is relatively flexible and is particularly suitable for being glued onto a curved surface. In the case of the label shown in FIG. 3, the base layer is formed only by an adhesive layer 50, which can be a transfer adhesive. The transfer adhesive 50 is applied to the underside of the top layer 20 and of the gas-permeable element 30, so that the gas-permeable element 30 is held in the label composite in stable manner. The adhesive layer 50 furthermore serves to glue the label onto the wall. Before use of the label, the adhesive layer 50 is covered by a liner 40 on its underside; this liner is pulled off the adhesive layer 50 for use.

The flexibility of the label in FIG. 3 can furthermore be improved in that the polymer layer 201 within the top layer 20 is formed from a particularly flexible plastic and is sufficiently thin. Instead of polyester, polyethylene (PE) or polyvinyl, chloride (PVC) are also suitable as the material for the polymer layer 201.

In FIG. 4, a further embodiment is shown, in which the top layer 60 is structured as a layer that can be inscribed with a laser. The topmost, outer layer 601 of the top layer 60 is formed from a polymer material, for example polyester. The polymer layer 601 is permeable for a laser beam and transparent for the human eye. Underneath the layer 601, there is a laser-active layer 602, which is modified when a laser beam impacts it. The laser-active layer contains metal particles, for example aluminum particles, which are embedded in the layer 602 and dissolve or migrate away when a laser energy pulse impacts them. As a result, the layer 602, which is originally opaque and non-transparent in the original state, becomes transparent and see-through for the human eye at the location where the laser beam impacts. The layer 603, which is an ink layer and forms a color contrast, is situated lowermost. As a result, the ink layer 603 is visible from above, through the layers 601, 602, at the impact location of the laser beam. In this manner, the label can be inscribed by a laser beam, in contact-free and individual manner. Because of the contact-free inscribing, the label layers and the membrane do not experience any mechanical stress. In particular, the laser inscribing can be carried out relatively late in the use process, for example even when the label has already been glued onto a wall. A Nd:YAG laser is suitable, for example, as a suitable laser for inscribing the laser-active layer 602 in the laser-inscribable top layer 60. Because of the use of a laser-active layer 602 as described above, which is covered by the transparent polymer layer 601, no vapor emissions or material erosions that might be harmful are given off into the environment. The label can therefore be used in particularly sustainable manner.

Finally, in FIG. 4 a wall 70 is shown, which has an opening 71. The wall 70 is, for example, a container that contains an electronic module, wherein the opening 71 allows pressure equalization between the interior of the housing and of the outer surroundings. The label is glued onto the wall, and the opening 71 overlaps with the openings in the top layer and base layer of the label, so that the membrane 30 allows pressure equalization and, at the same time, ensures controlled humidity conditions in the interior of the housing enclosed by the wall.

Instead of the laser-inscribable top layer 60 described above, a conventional laser-inscribable surface can be provided, of course, for example an aluminum vapor layer on a polymer film with a contrast layer lying underneath, wherein aluminum material is removed from the laser vapor layer by means of the laser beam.

The aluminum vapor layer or the laser-active layer 602 appears to an observer as a white or silvery surface, for example, in the original state. The contrast layer can be an aluminum vapor layer with a specific aluminum stoichiometry, for example, so that it appears black and therefore the laser inscription appears to the observer as black writing on a white or silvery background.

A protective layer, which comprises a polymer layer with a relatively easily adhering adhesive, can be applied to the top of the top layer 20, 60, in the label variants described above. Such a protective layer serves as varnish protection, for example, if the label that has already been glued onto a wall and provided with the varnish protection layer as the uppermost layer is varnished at the same time as the wall of the body or container. Subsequently, the varnish layer is pulled off, so that the label and its possible inscription are visible, and the membrane can bring about the pressure equalization. The varnish protection layer is equipped with a gripper tab, so that it can be pulled off the top layer 20.

In summary, a label with which an opening situated in a wall can be covered comprises a gas-permeable element that is embedded between a base layer 10 and a tops layer 20. Base layer and top layer have openings 11, 21 that overlap one another. The gas-permeable element is disposed between an adhesive layer 102 of the base layer and the top layer 20. According to embodiments, the opening of the top layer can project A beyond the edge of the opening of the lower layer and/or the top layer can project B beyond the outer edge of the lower layer. The label demonstrates sufficient mechanical stability and prevents the escape of adhesive.

The invention claimed is:

1. A label for covering an opening situated in a wall, comprising:
    a base layer having an opening, wherein the base layer comprises an adhesive;
    a top layer having an opening, wherein the base layer and the top layer are disposed one on top of the other, and the opening of the base layer and the opening of the top layer overlap;
    a gas-permeable element, which is disposed between the top layer and the base layer that comprises the adhesive, wherein the gas-permeable element comprises a section that lies in the region of the overlapping openings of the base layer and of the top layer, and a further section that lies between overlapping regions of the base layer and of the top layer, wherein a side of the top layer that faces the base layer is not coated with adhesive, and a side of the base layer that faces the top layer is coated with adhesive, which contacts the top layer, wherein one side of the gas-permeable element contacts the top layer and another side of the gas-permeable element contacts the adhesive, wherein the top layer projects in the region of the opening of the top layer beyond the edge of the base layer that forms the opening of the base layer by 0.3 mm to 0.7 mm, and wherein the top layer projects beyond the base layer such that an outer edge of the top layer projects beyond an outer edge of the base layer.

2. The label according to claim 1, in which a side of the top layer that faces the base layer is not coated with adhesive, and the base layer is formed from an adhesive layer.

3. The label according to claim 1, in which the adhesive contacts a side of the top layer that faces the base layer and a side of the gas-permeable element that faces away from the top layer.

4. The label according to claim 1, in which the top layer comprises a plurality of openings that are smaller in comparison with the opening, which openings overlap with the one opening of the base layer.

5. The label according to claim 1, in which the top layer comprises an opaque laser-active layer component which can be removed under the effect of a laser beam, or can be modified to such an extent that it becomes less opaque or transparent.

6. The label according to claim 1, in which the top layer comprises a layer that is permeable for a laser beam, and comprises an opaque, laser-active layer component on its side facing the base layer, which component can be modified via the effect of a laser beam, to such an extent that it becomes less opaque or transparent, and further comprises a contrast-forming layer, which faces the base layer.

7. The label according to claim 1, in which the gas-permeable element is a membrane that is non-permeable to liquids, or is a woven fabric that is non-permeable to liquids in the form of droplets.

8. The label according to claim 1, in which:
the base layer is configured as a section of a double-sided adhesive tape coated on both sides with adhesive, composed of polymer film, into which tape a circular opening with a diameter is introduced;
the gas-permeable element has a cross-section that is greater than the opening of the base layer, so that the gas-permeable element completely covers the opening of the base layer;
the top layer is a polymer film that is not coated with adhesive, and contains a circular opening, the diameter of which is smaller than the diameter of the opening of the base layer, wherein
the top layer touches the gas-permeable element and is adhesively connected with a side of the adhesive tape that is coated with adhesive;
the surface of the top layer is adhesively connected with the side of the adhesive tape that is coated with adhesive, is larger than the surface of the top layer that touches the gas-permeable element; and the top layer projects beyond the outer edge of the base layer along the entire circumference of the base layer.

9. A label for covering an opening situated in a wall, comprising:
a base layer having an opening, wherein the base layer comprises an adhesive;
a top layer having an opening, wherein the base layer and the top layer are disposed one on top of the other, and the opening of the base layer and the opening of the top layer overlap;
a gas-permeable element, which is disposed between the top layer and the base layer that comprises the adhesive,
wherein the gas-permeable element comprises a section that lies in the region of the overlapping openings of the base layer and of the top layer, and a further section that lies between overlapping regions of the base layer and of the top layer,
wherein a side of the top layer that faces the base layer is not coated with adhesive, and a side of the base layer that faces the top layer is coated with adhesive, which contacts the top layer,
wherein one side of the gas-permeable element contacts the top layer and another side of the gas-permeable element contacts the adhesive,
wherein the top layer projects beyond the base layer such that an outer edge of the top layer projects beyond an outer edge of the base layer, and
wherein the adhesive is a layer having a given thickness, and the top layer, in the region of the outer edge of the base layer, projects beyond the base layer by 8 times to 12 times the thickness of the adhesive or projects by 0.4 mm to 1.2 mm.

10. The label according to claim 9, in which a cross-section of the opening of the top layer is smaller than a cross-section of the opening of the base layer.

11. The label according to claim 9, in which a side of the top layer that faces the base layer is not coated with adhesive, and the base layer is formed from an adhesive layer.

12. The label according to claim 9, in which the adhesive contacts a side of the top layer that faces the base layer and a side of the gas-permeable element that faces away from the top layer.

13. The label according to claim 9, in which the top layer, in the region of the opening, projects beyond the edge of the base layer that forms the opening of the base layer by 0.3 mm to 0.7 mm.

14. The label according to claim 9, in which the top layer comprises a plurality of openings that are smaller in comparison with the opening, which openings overlap with the one opening of the base layer.

15. The label according to claim 9, in which the top layer comprises an opaque laser-active layer component which can be removed under the effect of a laser beam, or can be modified to such an extent that it becomes less opaque or transparent.

16. The label according to claim 9, in which the top layer comprises a layer that is permeable for a laser beam, and comprises an opaque, laser-active layer component on its side facing the base layer, which component can be modified via the effect of a laser beam, to such an extent that it becomes less opaque or transparent, and further comprises a contrast-forming layer, which faces the base layer.

17. The label according to claim 9, in which the gas-permeable element is a membrane that is non-permeable to liquids, or is a woven fabric that is non-permeable to liquids in the form of droplets.

18. The label according to claim 9, in which:
   the base layer is configured as a section of a double-sided adhesive tape coated on both sides with adhesive, composed of polymer film, into which tape a circular opening with a diameter is introduced;
   the gas-permeable element has a cross-section that is greater than the opening of the base layer, so that the gas-permeable element completely covers the opening of the base layer;
   the top layer is a polymer film that is not coated with adhesive, and contains a circular opening, the diameter of which is smaller than the diameter of the opening of the base layer, wherein
   the top layer touches the gas-permeable element and is adhesively connected with a side of the adhesive tape that is coated with adhesive;
   the surface of the top layer is adhesively connected with the side of the adhesive tape that is coated with adhesive, is larger than the surface of the top layer that touches the gas-permeable element; and
   the top layer projects beyond the outer edge of the base layer along the entire circumference of the base layer.

* * * * *